United States Patent
Kim et al.

(10) Patent No.: US 11,445,615 B2
(45) Date of Patent: Sep. 13, 2022

(54) TOUCH SENSOR MODULE AND IMAGE DISPLAY DEVICE COMPRISING SAME

(71) Applicant: Dongwoo Fine-Chem Co., Ltd., Jeollabuk-do (KR)

(72) Inventors: Jun-Ha Kim, Gyeonggi-do (KR); Dong-Jin Son, Chungcheongnam-do (KR)

(73) Assignee: Dongwoo Fine-Chem Co., Ltd., Jeollabuk-Do (KR)

( * ) Notice: Subject to any disclaimer, the term of this patent is extended or adjusted under 35 U.S.C. 154(b) by 0 days.

(21) Appl. No.: 17/184,572

(22) Filed: Feb. 24, 2021

(65) Prior Publication Data
US 2021/0289635 A1 Sep. 16, 2021

(30) Foreign Application Priority Data
Mar. 11, 2020 (KR) .................. 10-2020-0030364

(51) Int. Cl.
*H05K 3/34* (2006.01)
*G06F 3/044* (2006.01)
*H05K 1/11* (2006.01)

(52) U.S. Cl.
CPC .......... *H05K 3/3405* (2013.01); *G06F 3/044* (2013.01); *H05K 1/111* (2013.01); *H05K 1/118* (2013.01); *G06F 2203/04102* (2013.01); *H05K 2203/041* (2013.01)

(58) Field of Classification Search
CPC ...... H05K 3/3405; H05K 1/118; H05K 1/111; G06F 3/044
See application file for complete search history.

(56) References Cited

U.S. PATENT DOCUMENTS

| 5,729,896 A * | 3/1998 | Dalal ..................... H01L 24/16 29/840 |
| 6,347,040 B1 * | 2/2002 | Fries ..................... G06K 9/0002 361/760 |
| 2007/0146404 A1 * | 6/2007 | Bylehn ............. G05B 19/4097 347/15 |
| 2007/0253763 A1 * | 11/2007 | Spratte ................. B60G 17/019 403/119 |
| 2008/0157250 A1 * | 7/2008 | Yang .................... H04N 5/2254 257/433 |
| 2019/0197932 A1 * | 6/2019 | Asatani ................... G06F 3/044 |

FOREIGN PATENT DOCUMENTS

KR 10-2014-0127640 11/2014
KR 10-2018-0114558 10/2018

* cited by examiner

*Primary Examiner* — Fred Tzeng
(74) *Attorney, Agent, or Firm* — Wells St. John P.S.

(57) ABSTRACT

The present invention relates to a touch sensor module and an image display device including the same. The touch sensor module includes a touch sensor including pad portions, a flexible printed circuit board (FPCB) including terminal portions, and a solder joint interposed between the touch sensor and the flexible printed circuit board, in which the solder joint includes a solder paste including solder balls and a flux, the pad portions and the terminal portions are electrically connected through the solder balls compressed by heating and pressing, the flux is used in an amount of 5 to 40 wt % based on the total weight of the solder paste, and the ratio of the diameter of the solder balls included in the solder paste to the gap between the pad portions of the touch sensor and the terminal portions of the flexible printed circuit board is 1:0.2-0.6.

4 Claims, 4 Drawing Sheets

TOUCH SENSOR MODULE AND IMAGE DISPLAY DEVICE COMPRISING SAME

RELATED PATENT DATA

This application claims priority to KR Application No. 10-2020-0030364, filed Mar. 11, 2020, which is hereby incorporated herein by reference.

BACKGROUND OF THE INVENTION

1. Technical Field

The present invention relates to a touch sensor module and a display device including the same.

2. Description of the Related Art

With the recent development of information technology, various requirements for the display field have arisen. For example, various flat panel display devices having features such as thinness, lightness, low power consumption, and the like, for example, liquid crystal display devices, plasma display panel devices, electroluminescent display devices, organic light-emitting diode display devices, etc., have been studied.

Meanwhile, electronic devices having both an image display function and an information input function are being developed by combining a touch panel or a touch sensor, which is an input device that is overlaid on the display device and allows the user's command to be input by selecting the instruction content displayed on the screen with a person's hand or an object, with the display device.

For example, since the touch panel must be able to detect information, which is input in a touch manner, in the form of an electrical signal, it is configured to include a touch sensor for detecting a touch stimulus and a printed circuit board for transmitting a change in the signal on the touch sensor.

Here, the touch sensor and the printed circuit board may be electrically connected to each other with an anisotropic conductive film (ACF) interposed therebetween.

With regard thereto, Korean Patent Application Publication No. 10-2018-0114558 and Korean Patent Application Publication No. 10-2014-0127640 disclose a technique for electrically connecting the pad portions of a touch sensor and the electrodes of a flexible printed circuit board (FPCB) in a mechanical/physical contact manner through ACF including conductive particles. In the conventional ACF including such conductive particles, the conductive particles are mixed with an adhesive resin, for example, a thermosetting-type resin, and are manufactured in the form of a film.

However, the conventional method using ACF has a limitation in lowering the contact resistance between the touch sensor and the FPCB or increasing the tensile strength of the FPCB.

CITATION LIST

Patent Literature (Patent Document 1) Korean Patent Application Publication No. 10-2018-0114558
(Patent Document 2) Korean Patent Application Publication No. 10-2014-0127640

SUMMARY OF THE INVENTION

An objective of the present invention is to provide a touch sensor module having stable electrical properties when a touch sensor and an FPCB are connected.

The present invention provides a touch sensor module, including: a touch sensor including pad portions; a flexible printed circuit board (FPCB) including terminal portions; and a solder joint interposed between the touch sensor and the flexible printed circuit board, in which the solder joint includes a solder paste including solder balls and a flux, the pad portions and the terminal portions are electrically connected through the solder balls compressed by heating and pressing, the flux is used in an amount of 5 to 40 wt % based on the total weight of the solder paste, and the ratio of the diameter of the solder balls included in the solder paste to the gap between the pad portions of the touch sensor and the terminal portions of the flexible printed circuit (the diameter of the solder balls: the gap between the pad portions of the touch sensor and the terminal portions of the flexible printed circuit) is 1:0.2-0.6.

In addition, the present invention provides an image display device including the touch sensor module described above.

According to the present invention, a touch sensor module is configured to have stable electrical properties through metal bonding of the pad portions of a touch sensor and the terminal portions of an FPCB. Therefore, since the contact resistance between the pad portions of the touch sensor and the terminal portions of the FPCB can be lowered, the area of the pad portions of the touch sensor can be reduced. Accordingly, an image display device including the touch sensor module of the present invention has a minimized bezel region, so a larger screen can be realized in the same product size.

In addition, the touch sensor module according to the present invention is configured such that the pad portions of the touch sensor and the terminal portions of the FPCB are electrically connected through metal bonding, thus increasing the tensile strength of the FPCB. Moreover, it is possible to attain high reliability. Therefore, the touch sensor module of the present invention can be efficiently applied to a flexible display.

(110: pad portions, 200: a solder joint, 210: solder balls, 220: a flux, 300: a flexible printed circuit board, 310: terminal portions, and 400: a bonding tip)

DESCRIPTION OF SPECIFIC EMBODIMENTS

The present invention pertains to a touch sensor module and an image display device including the same.

The touch sensor module of the present invention is configured such that a touch sensor and a flexible printed circuit board (hereinafter referred to as an 'FPCB') are electrically connected through metal bonding that satisfies specific conditions, thereby lowering the contact resistance between the pad portions of the touch sensor and the terminal portions of the FPCB. Moreover, the touch sensor module may be efficiently applied to an image display device.

In a description of the present invention, when it is determined that a detailed description of a related known function or configuration may unnecessarily obscure the subject matter of the present invention, a detailed description thereof is omitted. In the present specification, when a part is said to be connected with another part, this includes not only direct connection, but also electrical connection with a further element interposed therebetween.

The features of various embodiments of the present invention can be partially or entirely coupled or combined with each other, and a variety of technical connections and operations are possible. In addition, embodiments may be performed independently of each other, or may be performed together in an interrelated manner.

Hereinafter, preferred embodiments of the present invention will be described in detail with reference to the accompanying drawings.

Figure 1:
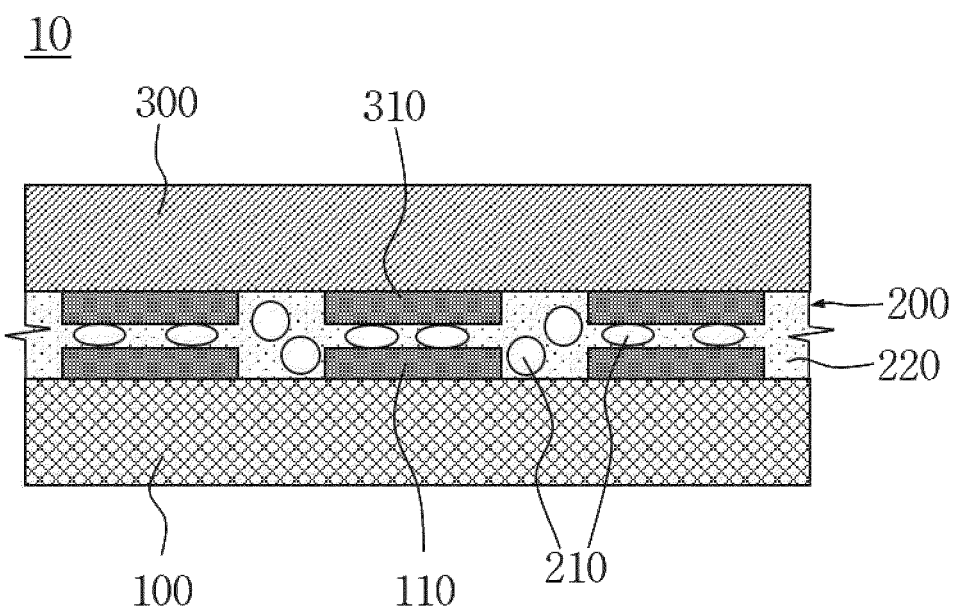
FIG. 1 is a cross-sectional view showing a touch sensor module according to an embodiment of the present invention.
Figure 2A:
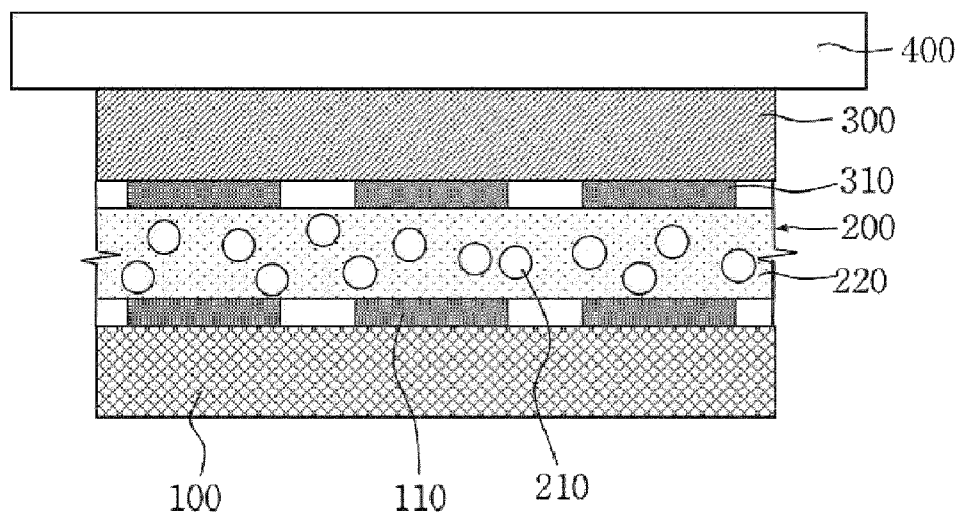
FIGS. 2A and 2B are views for explaining the sensor module according to an embodiment of the present invention.
Figure 2B:
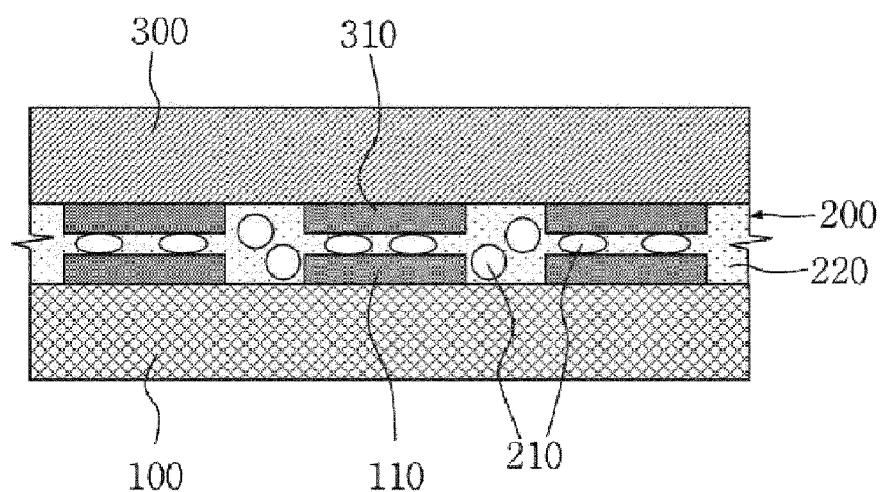
Figure 3:
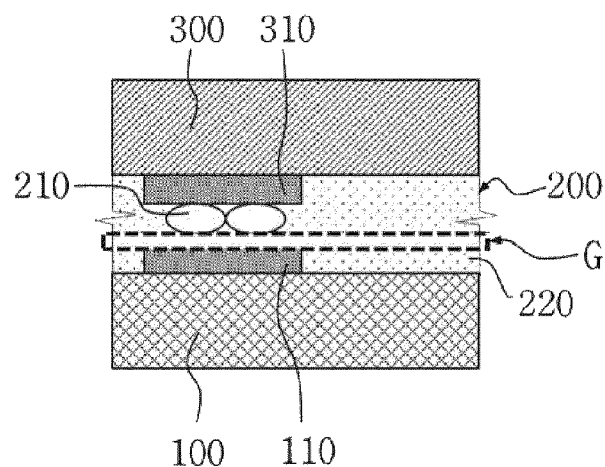
FIG. 3 is a reference view for explaining the present invention.
Figure 4:
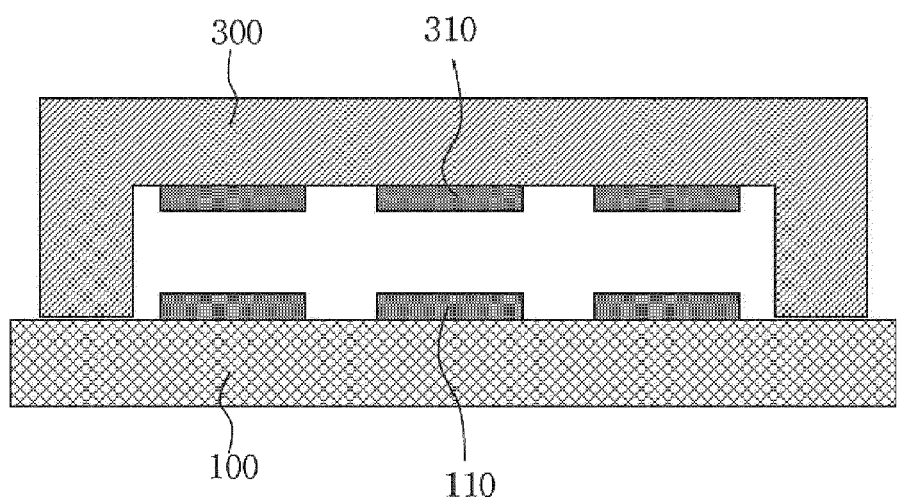
FIG. 4 is a view for explaining the touch sensor module according to an embodiment of the present invention.

FIG. 1 is a cross-sectional view showing a touch sensor module according to an embodiment of the present invention, and FIGS. 2A and 2B are views for explaining the sensor module according to an embodiment of the present invention. Also, FIG. 3 is a reference view for explaining the present invention, and FIG. 4 is a view for explaining the touch sensor module according to an embodiment of the present invention.

With reference to FIG. 1, a touch sensor module 10 according to the present invention includes a touch sensor 100, a solder joint 200, and a flexible printed circuit board 300.

In an embodiment thereof, the touch sensor 100 includes a touch-sensing electrode pattern (not shown) and pad portions 110 electrically connected to the touch-sensing electrode pattern.

The pad portions 110 are disposed on the substrate so as to come into contact with the solder joint 200 described below to conduct electricity to the FPCB 300.

The material for the substrate may be used without limitation, so long as it is one that is typically useful in the art, examples thereof including glass, polyethersulfone (PES), polyacrylate (PAR), polyether imide (PEI), polyethylene naphthalate (PEN), polyethylene terephthalate (PET), polyphenylene sulfide (PPS), polyarylate, polyimide, polycarbonate (PC), cellulose triacetate (TAC), and cellulose acetate propionate (CAP).

The pad portions 110 may be formed so that the FPCB 300 does not intrude into the active region of the substrate, that is, the region in which the touch-sensing electrode pattern is formed for recognition of a user's touch. For example, the pad portions 110 may be located at one end of the substrate.

As the touch-sensing electrode pattern, various electrode patterns known in the art may be used without limitation. For example, an electrode pattern used in a capacitive touch sensor may be included, and a mutual-capacitance manner or a self-capacitance manner may be applied.

In the mutual-capacitance manner, a grid pattern of a horizontal axis and a vertical axis may be provided. At the intersection of electrodes on the horizontal axis and the vertical axis, a bridge electrode may be included.

In the self-capacitance manner, an electrode pattern capable of reading a change in capacitance using one electrode at each point may be provided.

For the touch-sensing electrode pattern, any material may be used without limitation, so long as it is a conductive material, examples thereof including metal oxides selected from the group consisting of indium tin oxide (1:10), indium zinc oxide (IZO), indium zinc tin oxide (IZTO), indium-tin-oxide/silver/indium-tin-oxide (ITO—Ag—ITO) and the like, metals selected from the group consisting of gold (Au), silver (Ag), copper (Cu), molybdenum (Mo) and APC (Ag, Pd, and Cu alloys), metal nanowires selected from the group consisting of gold, silver, copper and lead, carbon-based materials selected from the group consisting of carbon nanotubes (CNT) and graphene, and conductive polymer materials selected from the group consisting of poly(3,4-ethylenedioxythiophene) (PEDOT) and polyaniline (PAM). These materials may be used alone or in combinations of two or more thereof.

The flexible printed circuit board (FPCB) 300 is disposed on one surface of the touch sensor 100 and includes terminal portions 310 that come into contact with the solder joint 200 described below.

The terminal portions 310 of the FPCB 300 may be electrically connected to the pad portions 110 of the touch sensor.

In the touch sensor module 10 according to an embodiment of the present invention, as shown in FIG. 1, the pad portions 110 and the terminal portions 310 may be electrically connected to each other by the solder joint 200.

Specifically, the solder joint 200 is interposed between the touch sensor 100 and the FPCB 300 for electrical connection of the touch sensor 100 and the FPCB 300.

In an embodiment of the present invention, the solder joint 200 may include a solder paste.

The solder paste includes solder balls 210 and a flux 220, and may further include a thickening agent, a solvent, an additive, and the like, as needed.

In exemplary embodiments, in the touch sensor module 10 of the present invention, the solder paste may be applied on the pad portions of the touch sensor or on the terminal portions of the FPCB, or may be manufactured in the form of an anisotropic conductive film (ACP), and may thus be used as the solder joint 200.

FIGS. 2A and 2B are views for explaining the touch sensor module according to an embodiment of the present invention, and FIG. 2A shows the state before the solder balls 210 are connected to the pad portions 110 of the touch sensor and of the FPCB, and FIG. 2B shows the state in which the solder balls 210 are connected to the pad portions 110 of the touch sensor and the terminal portions 310 of the FPCB.

With reference to FIGS. 2A and 2B, when heat and pressure are applied to the solder joint 200, the solder joint 200 is compressed. As the solder balls 210 are heated and pressed, the pad portions 110 and the terminal portions 310 may be electrically connected to each other.

For example, the pad portions 110 and the terminal portions 310 are electrically connected through the solder balls 210 compressed by heating and pressing.

Here, a bonding tip 400 may be used in order to transfer heat and pressure to the solder joint 200 between the touch sensor 100 and the FPCB 300.

In the present invention, the solder paste preferably includes a flux 220 in order to impart superior wettability (i.e. a low contact angle) to the pad portions 110 of the touch sensor and the terminal portions 310 of the FPCB and to remove the oxide film.

The amount of the flux 220 included in the solder paste may be 5 to 40 wt % based on the total weight of the solder paste. Preferably, the amount thereof is 10 to 20 wt %. When the amount of the flux 220 included in the solder paste falls within the above range, the contact resistance between the pad portions and the terminal portions of the FPCB may be significantly reduced, so the pad portions of the touch sensor and the terminal portions of the FPCB may be reliably electrically connected.

For example, in the touch sensor module of the present invention, the contact resistance between the pad portions 110 and the terminal portions 310, which are electrically connected, may be 0.1Ω to 10Ω.

Here, if the amount of the flux included in the solder paste is less than the above lower limit, wettability may deteriorate, and as shown in FIG. 3, a gap G may be formed between the solder balls 210 and the pad portions 110, and thus it may be impossible to form a stable solder joint. On the other hand, if the amount of the flux included in the solder paste exceeds the above upper limit, the contact resistance between the pad portions 110 and the terminal portions 310 may increase due to the use of the solder balls in a relatively lower amount.

In an embodiment thereof, the solder balls included in the solder paste of the present invention may be used without particular limitation, so long as they are known in the art.

In the touch sensor module 10 according to an embodiment of the present invention, the width and space of the pad portions may be formed within a predetermined range in order to ensure a contact area suitable for the size and amount of the solder balls. For example, the width of each of the pad portions 110 provided to the touch sensor 100 may be 100 to 200 μm, and the space between the pad portions 110 may also be 100 to 200 μm. Here, the terminal portions 310 of the FPCB may also be formed to have the same width and space as the pad portions 110.

Meanwhile, for efficient electrical connection between the touch sensor 100 and the FPCB 300, it is preferable that the pad portions 110 of the touch sensor and the terminal portions 310 of the FPCB be arranged in a straight line. However, due to device/material processing margins, there may occur a bonding tilt in which the pad portions 110 of the touch sensor and the terminal portions 310 of the FPCB are misaligned.

In the touch sensor module according to the present invention, the bonding tilt is designed at a maximum of 50 μm, thus preventing the bonding region from excessively enlarging due to the width of the pad portions 110 and the terminal portions 310 beyond the above-described range.

In an embodiment thereof, when the width and space of the pad portions 110 and the bonding tilt fall within the above ranges, the solder balls 210 may have a size of 1 to 50 μm. When the size of the solder balls 210 falls within the above range, a stable solder joint may be formed. However, if the size of the solder balls exceeds the above upper limit, a short may occur between the pad portions 110 provided to the touch sensor, whereas if the size of the solder balls is less than the above lower limit, it may be difficult to form a stable solder joint.

According to an embodiment of the present invention, the touch sensor module 10 may be configured to provide stable electrical properties by lowering the contact resistance between the pad portions 110 and the terminal portions 310, which are electrically connected.

For example, in the touch sensor module 10 of the present invention, the ratio of the diameter of the solder balls 210 included in the solder paste to the gap between the pad portions 110 of the touch sensor and the terminal portions 310 of the flexible printed circuit (the diameter of the solder balls: the gap between the pad portions of the touch sensor and the terminal portions of the flexible printed circuit) is preferably 1:0.2-0.6. Here, the diameter of the solder balls in the ratio means the diameter before being compressed by heating and pressing.

In the touch sensor module 10 according to the present invention, if the gap between the pad portions 110 and the terminal portions 310 is less than the above lower limit, a short may occur between the pad portions 110 provided to the touch sensor. On the other hand, if the gap therebetween exceeds the above upper limit, the electrical connection of the pad portions 110 and the terminal portions 310 may become poor.

In order to ensure that the gap between the pad portions 110 of the touch sensor and the terminal portions of the FPCB is within the above range, for example, the designed height (pressure) of the bonding tip 400 may be adjusted, or a height difference may be formed at both ends of the bonding tip such that the ratio of the diameter of the solder balls 210 included in the solder paste to the gap between the pad portions 110 of the touch sensor and the terminal portions 310 of the flexible printed circuit board is 1:0.2-0.6.

Moreover, as shown in FIG. 4, by adjusting the height in order to form a height difference at both ends of the FPCB, the gap between the pad portions 110 and the terminal portions 310 may be set to 20 to 60% of the diameter of the solder balls.

In addition, the present invention pertains to an image display device including the touch sensor module 10 described above.

The image display device according to the present invention, including the touch sensor module described above, is capable of minimizing a bezel region, thus making it possible to realize a larger screen in the same product size.

The touch sensor module of the present invention is capable of being applied to various image display devices, such as an electroluminescent display device, a plasma display panel device, a field emission display device, and the like, as well as a typical liquid crystal display device.

A better understanding of the present invention may be obtained through the following examples and test examples, but these examples are merely set forth to illustrate the present invention, and are not to be construed as limiting the appended claims, and various modifications and alternations are possible within the scope and spirit of the present invention, as will be apparent to those skilled in the art. Also, it is natural that such modifications and alterations fall within the scope of the appended claims.

EXAMPLES AND COMPARATIVE EXAMPLES

Examples 1 to 5 and Comparative Examples 1 to 6:
Touch Sensor Module

The solder pastes of Preparation Examples 1 to 5 and Comparative Preparation Examples 1 to 6 were prepared by mixing a flux and solder balls having a diameter of 25 μm. Here, the flux was added in the amount shown in Table 1 below.

Thereafter, the solder paste of each of Preparation Examples 1 to 5 and Comparative Preparation Examples 1 to 6 was applied on the pad portions of a touch sensor (one channel-bonding area: 85,500 μm² (150 μm (width)*550 μm (length))), after which a flexible printed circuit board (FPCB) was bonded thereto at 150° C. under a pressure of 1.5 MPa for 15 seconds, thus manufacturing touch sensor modules of Examples 1 to 5 and Comparative Examples 1 to 6, and the contact resistance between the pad portions of the touch sensor and the terminal portions of the FPCB was measured. The results thereof are shown in Table 2 below. Here, by adjusting the designed height of the bonding tip, the gap between the pad portions of the touch sensor and the terminal portions of the flexible circuit board was maintained at 40% (10 μm) of the size of the solder balls.

Examples 6 to 10 and Comparative Examples 7 to 11: Touch Sensor Module

The solder paste of Preparation Example 2 was applied on the pad portions of a touch sensor (one channel-bonding area: 85,500 μm² (150 μm (width)*550 μm (length))), after which a flexible printed circuit board (FPCB) was bonded thereto at 150° C. under a pressure of 1.5 MPa for 15 seconds, thus manufacturing touch sensor modules of Examples 6 to 10 and Comparative Examples 7 to 11. Here, by adjusting the designed height of the bonding tip, the gap between the pad portions of the touch sensor and the terminal portions of the flexible circuit board was adjusted to 4 to 80% (1 to 20 μm) of the size of the solder balls, as shown in Table 3 below. Thereafter, in the touch sensor modules thus manufactured, the contact resistance between the pad portions of the touch sensor and the terminal portions of the FPCB was measured. The results thereof are shown in Table 3 below.

Test Example: Measurement of Contact Resistance

Figure 5:
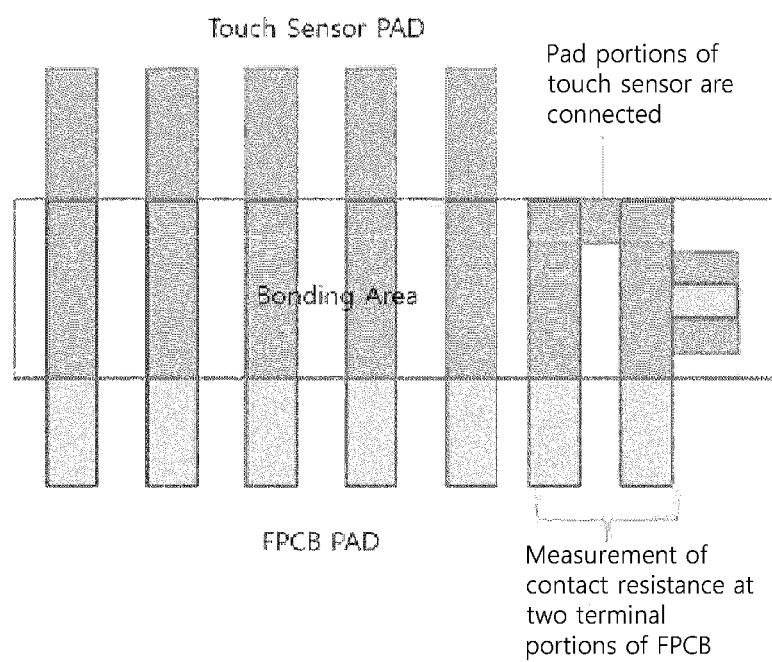
FIG. 5 is a reference view for explaining a process of measuring contact resistance according to Test Example of the present invention.

FIG. 5 is a reference view for explaining the process of measuring contact resistance according to Test Example of the present invention.

As shown in FIG. 5, points for measuring resistance thereof to the pad portions of the touch sensor were designed at respective ends of two terminal portions of the FPCB, and the contact resistance therebetween was measured.

TABLE 1

|  | Amount of flux in solder paste |
| --- | --- |
| Preparation Example 1 | 5% |
| Preparation Example 2 | 10% |
| Preparation Example 3 | 20% |
| Preparation Example 4 | 30% |
| Preparation Example 5 | 40% |
| Comparative Preparation Example 1 | 0% |
| Comparative Preparation Example 2 | 1% |
| Comparative Preparation Example 3 | 3% |
| Comparative Preparation Example 4 | 4.5% |
| Comparative Preparation Example 5 | 40.5% |
| Comparative Preparation Example 6 | 50% |

TABLE 2

|  | Solder paste | Contact resistance | Remark |
| --- | --- | --- | --- |
| Example 1 | A1 | 3 Ω | Solder joint condition OK |
| Example 2 | A2 | 1 Ω | Solder joint condition OK |
| Example 3 | A3 | 1 Ω | Solder joint condition OK |
| Example 4 | A4 | 3 Ω | Solder joint condition OK |
| Example 5 | A5 | 5 Ω | Solder joint condition OK |

TABLE 2-continued

|  | Solder paste | Contact resistance | Remark |
| --- | --- | --- | --- |
| Comparative Example 1 | A6 | ∞ | There is a gap between pad portions of touch sensor and solder |
| Comparative Example 2 | A7 | ∞ | There is a gap between pad portions of touch sensor and solder |
| Comparative Example 3 | A8 | 200 Ω | There is a gap between pad portions of touch sensor and solder |
| Comparative Example 4 | A9 | 25 Ω | Increased contact resistance, unsatisfactory |
| Comparative Example 5 | A10 | 20 Ω | Increased contact resistance, unsatisfactory |
| Comparative Example 6 | A11 | 30 Ω | Less number of solder balls in contact portion => increased resistance |

A1 to A5: Solder pastes of Preparation Examples 1 to 5
A6 to A11: Solder pastes of Comparative Preparation Examples 1 to 6

TABLE 3

|  | Gap (relative to diameter of solder balls (25 μm)) | Contact resistance | Remark |
| --- | --- | --- | --- |
| Example 6 | 5 μm (20%) | 1 Ω | Solder joint condition OK |
| Example 7 | 8 μm (32%) | 1 Ω | Solder joint condition OK |
| Example 8 | 10 μm (40%) | 1 Ω | Solder joint condition OK |
| Example 9 | 12.5 μm (50%) | 1 Ω | Solder joint condition OK |
| Example 10 | 15 μm (60%) | 3 Ω | Solder joint condition OK |
| Comparative Example 7 | 1 μm (4%) | Short | Short occurred between pad portions of touch sensor |
| Comparative Example 8 | 3 μm (12%) | Short | Short occurred between pad portions of touch sensor |
| Comparative Example 9 | 4.5 μm (18%) | Short | Short occurred between pad portions of touch sensor |
| Comparative Example 10 | 15.5 μm (62%) | 50 Ω | Increased contact resistance, poor contact between pad portions and solder |
| Comparative Example 11 | 20 μm (80%) | ∞ | Poor contact between pad portions and solder |

As is apparent from Tables 2 and 3, Examples 1 to 10 of the present invention exhibited stable electrical properties through metal bonding using the solder balls, and the contact resistance between the pad portions of the touch sensor and the terminal portions of the FPCB was relatively low.

In contrast, in Comparative Examples 1 to 11, a gap was formed as shown in FIG. 3, so the pad portions of the touch sensor and the terminal portions of the FPCB were not efficiently electrically connected, the contact resistance was increased, or a short occurred between the pad portions provided to the touch sensor.

What is claimed is:
1. A touch sensor module, comprising:
a touch sensor comprising pad portions;
a flexible printed circuit board comprising terminal portions; and
a solder joint interposed between the touch sensor and the flexible printed circuit board,
wherein the solder joint comprises a solder paste comprising solder balls and a flux,
the pad portions and the terminal portions are electrically connected through the solder balls compressed by heating and pressing,
wherein a contact resistance between the pad portions and the terminal portions, which are electrically connected, is 1Ω to 5Ω,
the flux is used in an amount of 5 to 40 wt % based on a total weight of the solder paste, and a ratio of a diameter of the solder balls to a gap between the pad portions of the touch sensor and the terminal portions of the flexible printed circuit, which is a ratio of the diameter of the solder balls in the solder paste to the gap between the pad portions of the touch sensor and the terminal portions of the flexible printed circuit, is 1:0.2-0.6.

2. The touch sensor module of claim 1, wherein a width of each of the pad portions provided to the touch sensor and a space between the pad portions are 100 to 200 µm.

3. The touch sensor module of claim 2, wherein the solder balls have a size of 1 to 50 µm.

4. An image display device comprising the touch sensor module of claim 1.

\* \* \* \* \*